(12) United States Patent
Prior

(10) Patent No.: US 6,759,718 B2
(45) Date of Patent: Jul. 6, 2004

(54) SEMICONDUCTOR PACKAGE WITH A SENSOR HAVING A FASTENING INSERT

(75) Inventor: Christophe Prior, Le Versoud (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/298,189

(22) Filed: Nov. 14, 2002

(65) Prior Publication Data

US 2003/0122249 A1 Jul. 3, 2003

(30) Foreign Application Priority Data

Nov. 14, 2001 (FR) .............................................. 01 14739

(51) Int. Cl.[7] ...................... H01L 29/76; H01L 29/94; H01L 31/062; H01L 31/113; H01L 31/119
(52) U.S. Cl. ........................................ 257/396; 257/622
(58) Field of Search .............................. 257/396, 431, 257/620, 622, 623, 676, 678, 706, 730, 783, 787, 796

(56) References Cited

U.S. PATENT DOCUMENTS 4,622,580 A * 11/1986 Levine ........................ 348/337

| | | |
|---|---|---|
| 5,098,630 A | 3/1992 | Ogiu et al. |
| 5,289,002 A | 2/1994 | Tarn |

FOREIGN PATENT DOCUMENTS

| | | |
|---|---|---|
| EP | 0 313 174 A2 | 4/1989 |
| EP | 0 398 575 A2 | 11/1990 |
| EP | 0 450 580 A2 | 10/1991 |

* cited by examiner

*Primary Examiner*—David Nhu
(74) *Attorney, Agent, or Firm*—Lisa K. Jorgenson; Stephen Bongini; Fleit, Kain, Gibbons, Gutman, Bongini & Bianco, P.L.

(57) ABSTRACT

A semiconductor package is provided that includes an electrical connection and support means having a front face and a recess in the front face. The semiconductor package also includes a semiconductor component having a front face including a sensor and a rear face which presses on the bottom of the recess of the electrical connection and support means. Further included in the semiconductor package is a positioning and locking means for locking the semiconductor component onto the electrical connection and support means. The positioning and locking means is engaged in a space which separates the periphery of the semiconductor component from the periphery of the recess and keeps the semiconductor component pressed against the bottom of the recess. Thus, there is provided a semiconductor package having efficiently oriented components.

22 Claims, 4 Drawing Sheets

SEMICONDUCTOR PACKAGE WITH A SENSOR HAVING A FASTENING INSERT

CROSS-REFERENCE TO RELATED APPLICATIONS

This application is based upon and claims priority from French Patent Application No. 0114739, filed Nov. 14, 2001, the entire disclosure of which is herein incorporated by reference.

BACKGROUND OF THE INVENTION

1. Field of the Invention

The present invention relates to the field of semiconductor packages having a sensor, and more specifically to semiconductor packages having an optical, chemical or movement sensor.

2. Description of Related Art

Conventionally, semiconductor packages with sensors, generally optical sensors, include an electrical connection and support plate, to the front face of which the rear face of a semiconductor component is fastened using a layer of adhesive, and an optical system placed in front of and at a distance from the front face, fitted with a sensor, of the semiconductor component. In general, an arrangement of this sort presents problems in positioning the optical system with respect to the optical sensor of the semiconductor component because of the accumulation of the fabrication tolerances.

Therefore, a need exists to overcome the problems with the prior art as discussed above, and particularly for a way to efficiently orient the components of a semiconductor package.

SUMMARY OF THE INVENTION

In view of these drawbacks, it is an object of the present invention to overcome the above-mentioned drawbacks and to provide a semiconductor package having efficiently oriented components.

One embodiment of the present invention provides a semiconductor package that includes an electrical connection and support means having a front face and a recess in the front face. The semiconductor package also includes a semiconductor component having a front face including a sensor and a rear face which presses on the bottom of the recess of the electrical connection and support means. Further included in the semiconductor package is a positioning and locking means for locking the semiconductor component onto the electrical connection and support means. The positioning and locking means is engaged in a space which separates the periphery of the semiconductor component from the periphery of the recess and keeps the semiconductor component pressed against the bottom of the recess. In a preferred embodiment of the present invention, the positioning and locking means includes at least one insert cooperating with the periphery of the semiconductor component and the periphery of the recess.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
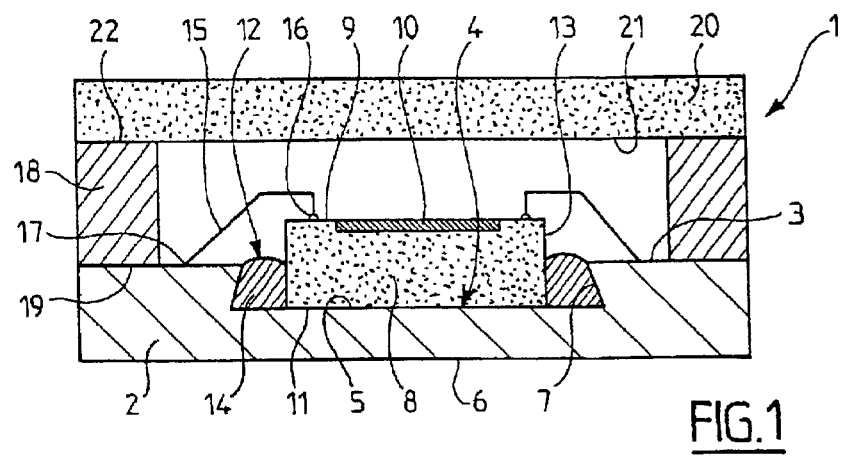
FIG. 1 shows a median cross section along I—I of FIG. 2 of a first semiconductor package according to one embodiment of the present invention.

Preferred embodiments of the present invention will be described in detail hereinbelow with reference to the attached drawings.

Preferred embodiments of the present invention provide a semiconductor package that includes an electrical connection and support means having a front face and a recess in the front face. The semiconductor package also includes a semiconductor component having a front face including a sensor and a rear face which presses on the bottom of the recess of the electrical connection and support means. Further included in the semiconductor package is a positioning and locking means for locking the semiconductor component onto the electrical connection and support means. The positioning and locking means is engaged in a space which separates the periphery of the semiconductor component from the periphery of the recess and keeps the semiconductor component pressed against the bottom of the recess.

In one embodiment of the present invention, the positioning and locking means includes at least one insert cooperating with the periphery of the semiconductor component and the periphery of the recess. In one alternative, the positioning and locking means includes at least one part engaged in at least one hole made in the bottom of the said recess. In another alternative, the positioning and locking means includes a side part pressing on the front face of the semiconductor component. In yet another alternative, the positioning and locking means includes a side part pressing on the front face of the electrical connection and support means.

In still another alternative, the positioning and locking means includes at least one insert which is self-locked by being wedged into the space which separates the periphery of the semiconductor component from the periphery of the recess. In yet another alternative, the positioning and locking means includes one insert adhesively bonded to the electrical connection and support means. In a further alternative, the positioning and locking means includes an annular insert which is self-locked by being wedged into an annular space separating the periphery of the said semiconductor component from the periphery of the said recess.

In some embodiments of the present invention, a layer of adhesive is inserted between the side part and the front face of the semiconductor component and/or the electrical connection and support means. Further, in some embodiments of the present invention, the peripheral wall of the recess is undercut. The insert is preferably made of an elastic material.

In one embodiment of the present invention, an encapsulation means encapsulates the front face of the semiconductor component. The encapsulation means preferably includes a ring fastened to the front face of the electrical connection and support means and a plate made of a transparent material located at a distance from the front face of the semiconductor component and fastened to the ring. In an alternative embodiment, the encapsulation means includes a plate made of a transparent material placed at a distance from the front face of the semiconductor component and fastened to the positioning and locking means.

Exemplary embodiments of the present invention will now be described in detail with reference to FIGS. 1–8.

Figure 2:
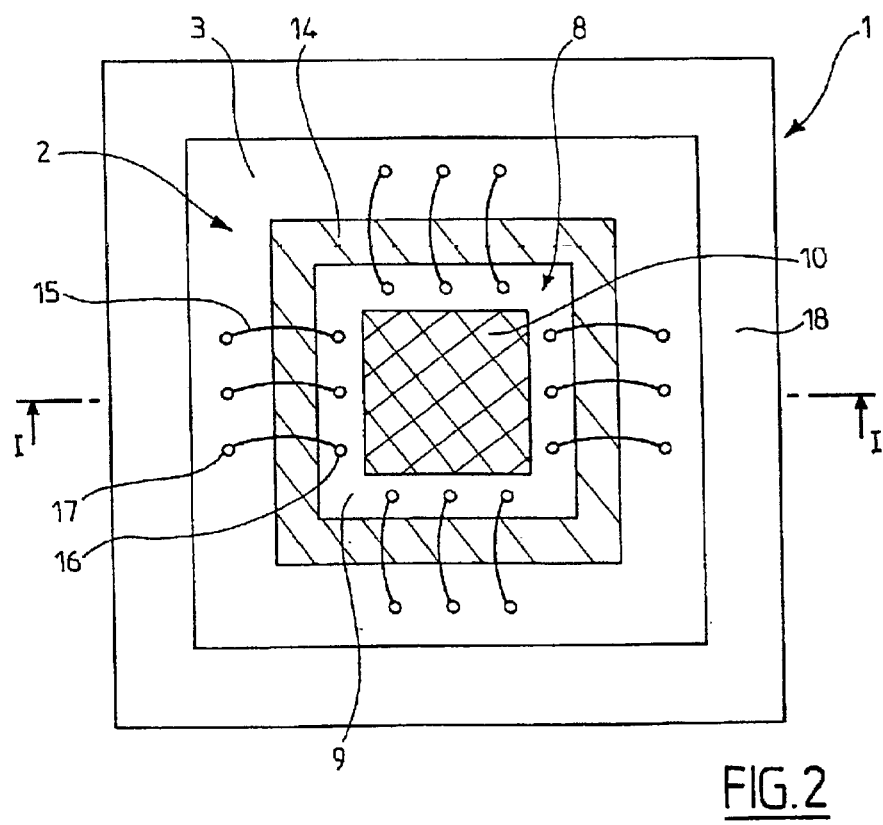
FIG. 2 shows a top view of the semiconductor package of FIG. 1.

With reference to FIGS. 1 and 2, a semiconductor package 1 is shown which includes an electrical connection and support plate 2, which has a front face 3 in which a recess 4 is made. The semiconductor package 1 further includes a flat bottom 5 parallel to the rear face 6 of the plate 2 and four undercut side walls 7.

The semiconductor component 1 includes a parallelepipedal-shaped semiconductor component 8, the front face 9 of which has, in its central part, an optical sensor 10 and the rear face 11 of which presses on the bottom 5 of the recess 4 of the plate 2. The semiconductor package 1 further includes a semiconductor component 8 placed in the central part of the recess 4 so as to leave an annular space 12 between its peripheral wall 13 and the peripheral wall 7 of the recess 4. By way of example, the thickness of the semiconductor component 8 in the illustrated embodiment is greater than the depth of the recess 4 such that it protrudes forward. An annular insert 14, for locking and holding the semiconductor component 8 in the recess 4 and pressing against the bottom 5 thereof, is placed in the annular space 12.

The semiconductor package 1 further includes electrical connection wires 15, the ends of which are connected to electrical connection pads 16 provided on the front face 9 of the semiconductor component 8, at the periphery and at a distance from the optical sensor 10. The ends of the electrical connection wires 15 are also connected to electrical connection pads 17 provided on the front face 3 of the plate 2 (for example, midway between the peripheral edge of the recess 5 and the peripheral edge of this plate).

The electrical connection and support plate 2 is made of a multilayer insulating material incorporating electrical connection tracks in order to connect the front pads 17 to electrical connection pads provided on its rear face 6. In an alternative embodiment, the electrical connection and support plate 2 could be made of metal and carry on its front face 3, on its side faces and/or its rear face 6, insulated electrical connection tracks formed on an intermediate layer made of an insulating material.

The semiconductor package 1 also includes an attached peripheral ring 18, the front face 19 of which is fastened to the periphery of the plate 2 (by adhesive bonding, for example) to the outside of the electrical connection pads 17, and a plate 20 made of a transparent material such as glass. The periphery of the rear face 21 of plate 20 is fastened to the front face 22 of the ring 18 with the transparent plate 20 extending in front of the semiconductor component 8 and electrical connection wires 15 so as to constitute encapsulation means.

Figure 3:
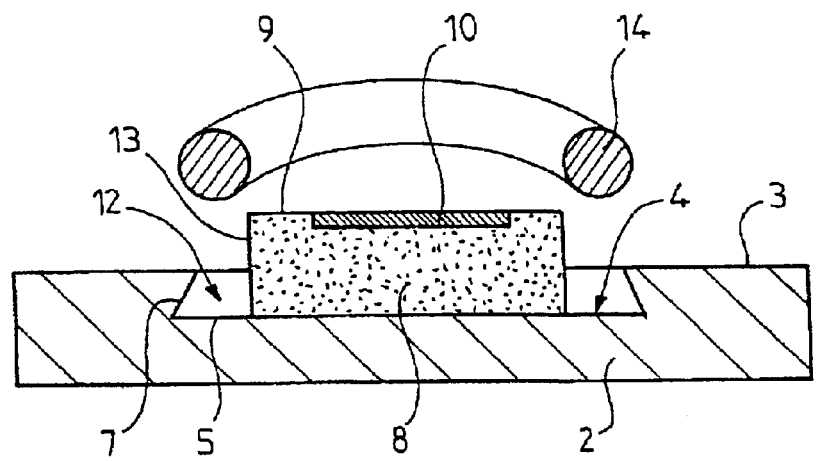
FIG. 3 shows a median cross section of the semiconductor package of FIG. 1 and FIG. 2 during fabrication.

In one embodiment, the semiconductor package 1 is fabricated as follows. FIG. 3 shows the electrical connection and support plate 2 having the recess 4. Using known transfer and pressing means (not shown), the optical semiconductor component 8 is fitted to the center of the recess 4, such that its rear face 11 presses against the bottom 5 of the recess 4 and is held there.

Figure 4:
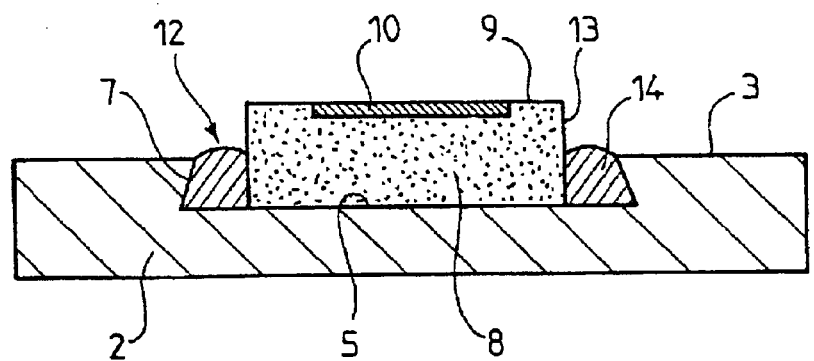
FIG. 4 shows a median cross section of the semiconductor package of FIG. 1 and FIG. 2 later during fabrication.

As is shown in FIG. 4, an annular insert 14 is preformed (for example, to correspond with the annular space 12 and consisting of an elastic material such as an silicone). Using suitable transfer means (not shown), the annular insert 14 is taken and forcibly engaged into the annular space 12 such that it fills this space thereby exerting a pressure against the bottom 5 and the side wall 7 of the recess 4 and against the peripheral wall 13 of the semiconductor component 8 in the direction of the bottom 5 of the recess 4. In alternative embodiments, a provision could be made for positioning and holding insert 14 to consist of a thermoplastic or a deposited bead of gel such as a silicone gel, which is cured by placing the assembly under a heat source. Next, the electrical connection wires 15 and the ring 18, or vice versa, are fitted. Finally, the transparent plate 1 is fastened to the ring 18.

Figure 5:
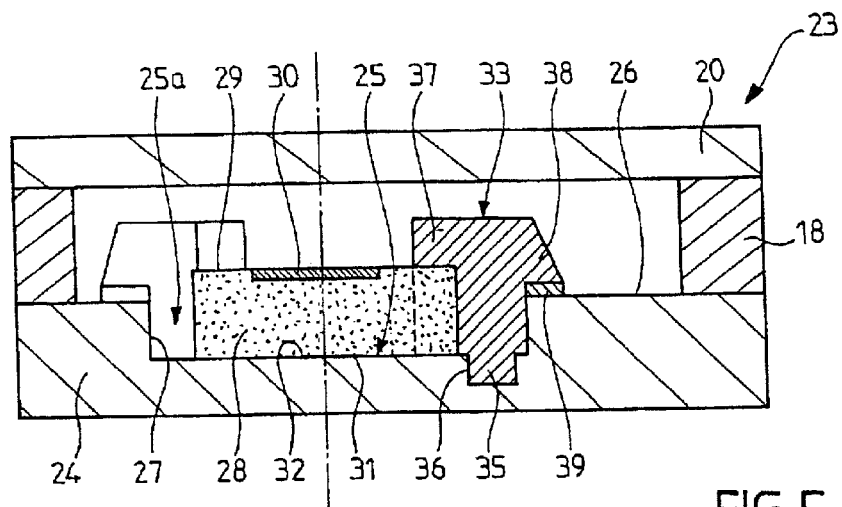
FIG. 5 shows a cross-section along V—V of FIG. 6 of a second semiconductor package according to another embodiment of the present invention.
Figure 6:
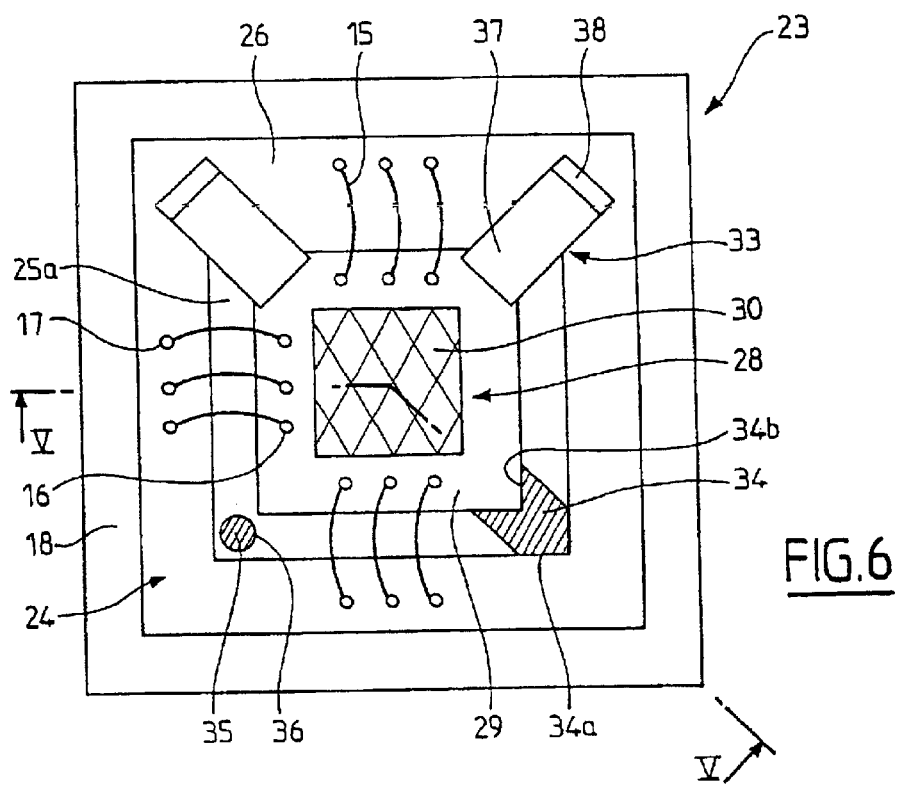
FIG. 6 shows a top view of the semiconductor package of FIG. 5.

With reference to FIG. 5 and FIG. 6, a semiconductor package 23, according to another embodiment, is shown, which is distinguished from that described with reference to FIGS. 1–4 in that electrical connection and support plate 24 has a recess 25 in its front face 26, while the flanks or side walls 27 of this recess 25 are straight. The semiconductor package 23 is also distinguished in that its optical semiconductor component 28, the front face 29 of which has an optical sensor 30 and the rear face 31 of which presses against the bottom 32 of the recess 25, is held in position and locked by four local inserts 33 placed between the corners of the semiconductor component 28 and those of the recess 25.

More particularly, each insert 33 is made, for example, of a thermoplastic such as a technical-grade polymer with a high melting point, such as greater than 300 degrees Celsius. Each insert 33 includes a central part 34 engaged in the annular space 25a between the semiconductor component 28 and the peripheral wall 27 of the recess 25. This central part 34 has an outer rib 34a, which closely matches the concave corner of the recess 25, and an inner groove 34b, which closely matches the convex corner of the semiconductor component 28. Each insert 33 also includes a projecting part 35 formed below its central part 34 and of circular cross section. The projecting part 35 is engaged in a circular hole 36 made in the bottom 32 of the recess 25.

Each insert 33 further includes an inner side part 37 which extends in front of the semiconductor component 28 and which presses on a corner of the front face 29, and an outer side part 38, which extends in front of the front face 26 of the connection and support plate 24. Near the corner of its recess 25, a layer of adhesive 39 is inserted between the outer side part 38 and the front face 26 of the electrical connection and support plate 24.

In an alternative embodiment, the central parts 34 of the four positioning and locking inserts 33 are dimensioned so as to press against the corners of the semiconductor component 28 and of the recess 25 of the electrical connection and support plate 24. In another alternative embodiment, the parts 34 of the positioning and locking inserts 33 leave a clearance between each other and the corners of the semiconductor component 28 and/or the corners of the recess 25 of the positioning and electrical connection plate 24.

In yet another alternative embodiment, the flanks 27 of the recess 25 of the electrical connection and support plate 24 are inclined so as to constitute a trough-shaped recess 25 and the flanks of the outer rib 34a of the central part 34 of the positioning and locking inserts 33 could also be inclined in a corresponding manner. Further, a clearance is optionally provided between the inner groove 34b of the central parts 34 of the inserts 33 and the corners of the semiconductor component 28, so as to produce an additional lever effect applied to the inner side part 37 on the front surface 29 of the semiconductor component 28.

In one embodiment, the semiconductor package 23 is assembled as follows. The semiconductor component 28 is fitted at the center and held in the recess 25 of the electrical connection and support plate 24. Four layers of adhesive 39 are deposited on the front face 26 of the electrical connection and support plate 24 on the regions adjacent to its recess 25 and the four inserts 33 are engaged until bringing them into their assembled position described above. Once the adhesive layers 39 are cured, the electric wires 25 are fitted and the peripheral ring 18 and the transparent front plate 20 are assembled as in the embodiment described above.

Figure 7:
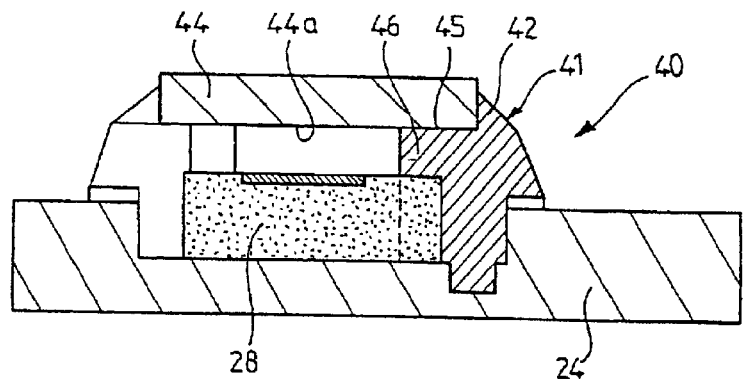
FIG. 7 shows a cross-section along VII—VII of FIG. 8 of a third semiconductor package according to yet another embodiment of the present invention.
Figure 8:
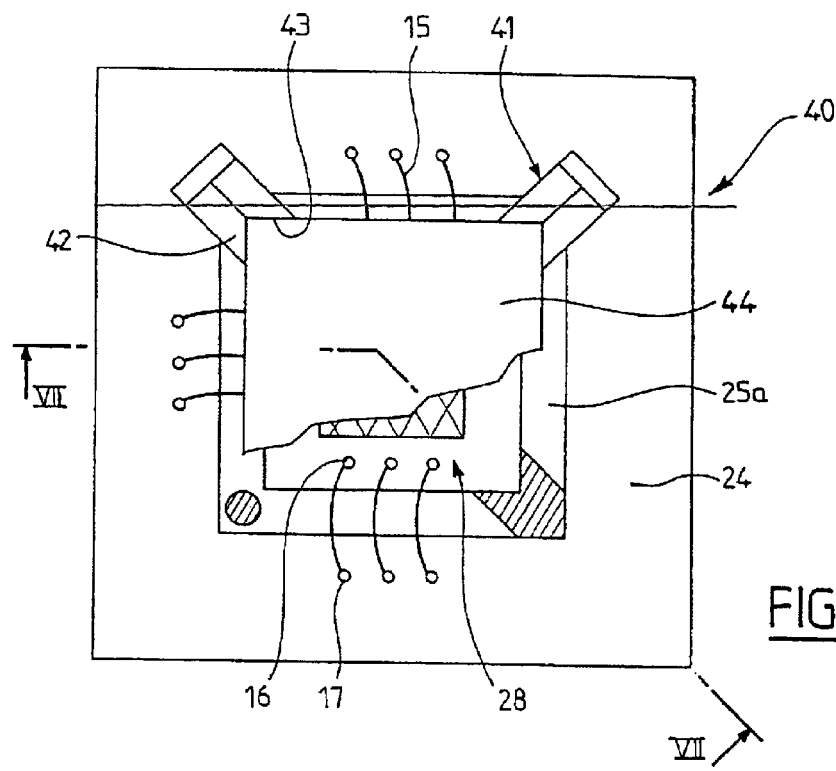
FIG. 8 shows a top view of the semiconductor package of FIG. 7.

With reference to FIG. 7 and FIG. 8, a semiconductor package 40 according to yet another embodiment is shown, which is distinguished from the semiconductor package described with reference to FIG. 5 and FIG. 6 in that the peripheral ring 14 and the transparent plate 20 are removed and in that local inserts 41 are provided, which are moreover identical to the local inserts 33 of the previous embodiment, which have front projecting parts 42 that define the inner ribs 43.

The semiconductor package 40 includes a plate 44 made of a transparent material, the rear face 44a of which presses against the front faces 45 of the inner side parts 46 of the local inserts 41 and the corners of which are engaged in their inner ribs 43. The transparent plate 44 extends in front of and at a distance from the front face of the semiconductor component 28 and the electrical connection wires 15 pass between the front face of the semiconductor component 28 and the rear face of the transparent plate 44.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor package comprising:
   an electrical connection and support means that includes a front face and a recess in the front face;
   a semiconductor component comprising a front face including a sensor and a rear face which presses on a bottom of the recess of the electrical connection and support means;
   positioning and locking means for locking the semiconductor component onto the electrical connection and support means,
   wherein the positioning and locking means is engaged in a space which separates a periphery of the semiconductor component from a periphery of the recess and keeps the semiconductor component pressed against the bottom of the recess.

2. The semiconductor package of claim 1, wherein the positioning and locking means includes at least one insert cooperating with the periphery of the semiconductor component and the periphery of the recess.

3. The semiconductor package of claim 2, wherein the at least one insert is made of an elastic material.

4. The semiconductor package of claim 1, wherein the positioning and locking means includes at least one element engaged in at least one hole made in the bottom of the recess.

5. The semiconductor package of claim 1, wherein the positioning and locking means includes a side element pressing on the front face of the semiconductor component.

6. The semiconductor package of claim 5, wherein a layer of adhesive is inserted between the side element and the front face of the semiconductor component.

7. The semiconductor package of claim 1, wherein the positioning and locking means includes a side element pressing on the front face of the electrical connection and support means.

8. The semiconductor package of claim 7, wherein a layer of adhesive is inserted between the side element and the electrical connection and support means.

9. The semiconductor package of claim 1, wherein the positioning and locking means includes at least one insert which is self-locked by being wedged into the space.

10. The semiconductor package of claim 1, wherein the positioning and locking means includes at least one insert adhesively bonded to the electrical connection and support means.

11. The semiconductor package of claim 1, wherein the positioning and locking means includes an annular insert which is self-locked by being wedged into an annular space separating the periphery of the semiconductor component from the periphery of the recess.

12. The semiconductor package of claim 1, wherein peripheral wall of the recess is undercut.

13. The semiconductor package of claim 1, further comprising encapsulation means for encapsulating the front face of the semiconductor component.

14. The semiconductor package of claim 13, wherein the encapsulation means includes a ring fastened to the front face of the electrical connection and support means, and a plate made of a transparent material located at a distance from the front face of the semiconductor component and fastened to the ring.

15. The semiconductor package of claim 13, wherein the means for encapsulating includes a plate made of a transparent material placed at a distance from the front face of the semiconductor component and fastened to the positioning and locking means.

16. A semiconductor package comprising:
   a conductive plate having a front face and a recess in the front face;
   a semiconductor component having a front face including a sensor and a rear face, the rear face pressing on a bottom of the recess of the conductive plate; and
   at least one insert for positioning and locking the semiconductor component onto the conductive plate,
   wherein the insert is engaged in a space which separates a periphery of the semiconductor component from a periphery of the recess and keeps the semiconductor component pressed against the bottom of the recess.

17. The semiconductor package of claim 16, wherein the insert cooperates with the periphery of the first component and the periphery of the recess.

18. The semiconductor package of claim 16, wherein the insert is engaged in at least one hole made in the bottom of the recess.

19. The semiconductor package of claim 16, wherein the insert includes a side element pressing on the front face of the semiconductor component.

20. The semiconductor package of claim 16, wherein the insert includes a side element pressing on the front face of the electrical connection and support means.

21. The semiconductor package of claim 16, wherein the insert is self-locked by being wedged into the space.

22. The semiconductor package of claim 16, wherein the insert is an annular insert which is self-locked by being wedged into an annular space separating the periphery of the semiconductor component from the periphery of the recess.

* * * * *